United States Patent
Yang

(10) Patent No.: US 6,534,223 B1
(45) Date of Patent: Mar. 18, 2003

(54) METHOD OF FORMING A CIRCUITRY FABRICATION MASK HAVING A SUBTRACTIVE ALTERNATING PHASE SHIFT REGION

(75) Inventor: Baorui Yang, Pflugerville, TX (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 09/629,395

(22) Filed: Aug. 1, 2000

(51) Int. Cl.$^7$ ............................... G03F 9/00; G03C 5/00
(52) U.S. Cl. ............................ 430/5; 430/323; 430/324
(58) Field of Search ......................... 430/5, 312, 313, 430/314, 315, 316, 317, 322, 323, 324

(56) References Cited

U.S. PATENT DOCUMENTS

| | | | |
|---|---|---|---|
| 5,376,483 A | * 12/1994 | Rolfson | 430/5 |
| 5,487,963 A | * 1/1996 | Sugawara | 430/5 |
| 6,007,950 A | * 12/1999 | Lin | 430/5 |

FOREIGN PATENT DOCUMENTS

JP 08-8022113 1/1996

OTHER PUBLICATIONS

Rich Ferguson, IBM, *Image Imbalance*, Optical Extensions Workshop, Portland, Oregon (May 13–14, 1999) 18 pages.
Christophe Pierrat et al., *Phase–Shifting Mask Topography Effects on Lithographic Image Quality*, SPIE vol. 1927 Optical/Laser Microlithography VI (1993) pp. 28–41.
U.S. patent application Ser. No. 09/643,005, Winder et al., filed Aug. 21, 2000.
Griesinger et al., *Transmission & Phase Balancing of Alternating Phase Shifting Masks (5X)—Theoretical & Experimental Results*, SPIE99 #3873–36, pp. 1–11 (1999).

* cited by examiner

*Primary Examiner*—Mark F. Huff
*Assistant Examiner*—Saleha R. Mohamedulla
(74) *Attorney, Agent, or Firm*—Wells St. John P.S.

(57) ABSTRACT

A light shielding layer is formed over a light transmissive substrate. The light shielding layer is patterned to have at least a portion having a first series of openings which alternate with a second series of openings. One of the first series of openings or the second series of openings is effectively masked while leaving the other of the first series of openings or the second series of openings effectively unmasked. While the one openings are effectively masked and the other openings are effectively unmasked, a species is ion implanted into the light transmissive substrate through the other openings. The implanted species effectively increases a wet etch rate of the light transmissive substrate in a wet etch chemistry compared to light transmissive substrate which is not effectively implanted with the species. The species implanted light transmissive substrate is wet etched through the other openings substantially selective to light transmissive substrate which is not effectively implanted with the species effective to at least partially form alternating phase shift regions through the other openings as compared to the alternating one openings. Other implementations and aspects are contemplated.

36 Claims, 4 Drawing Sheets

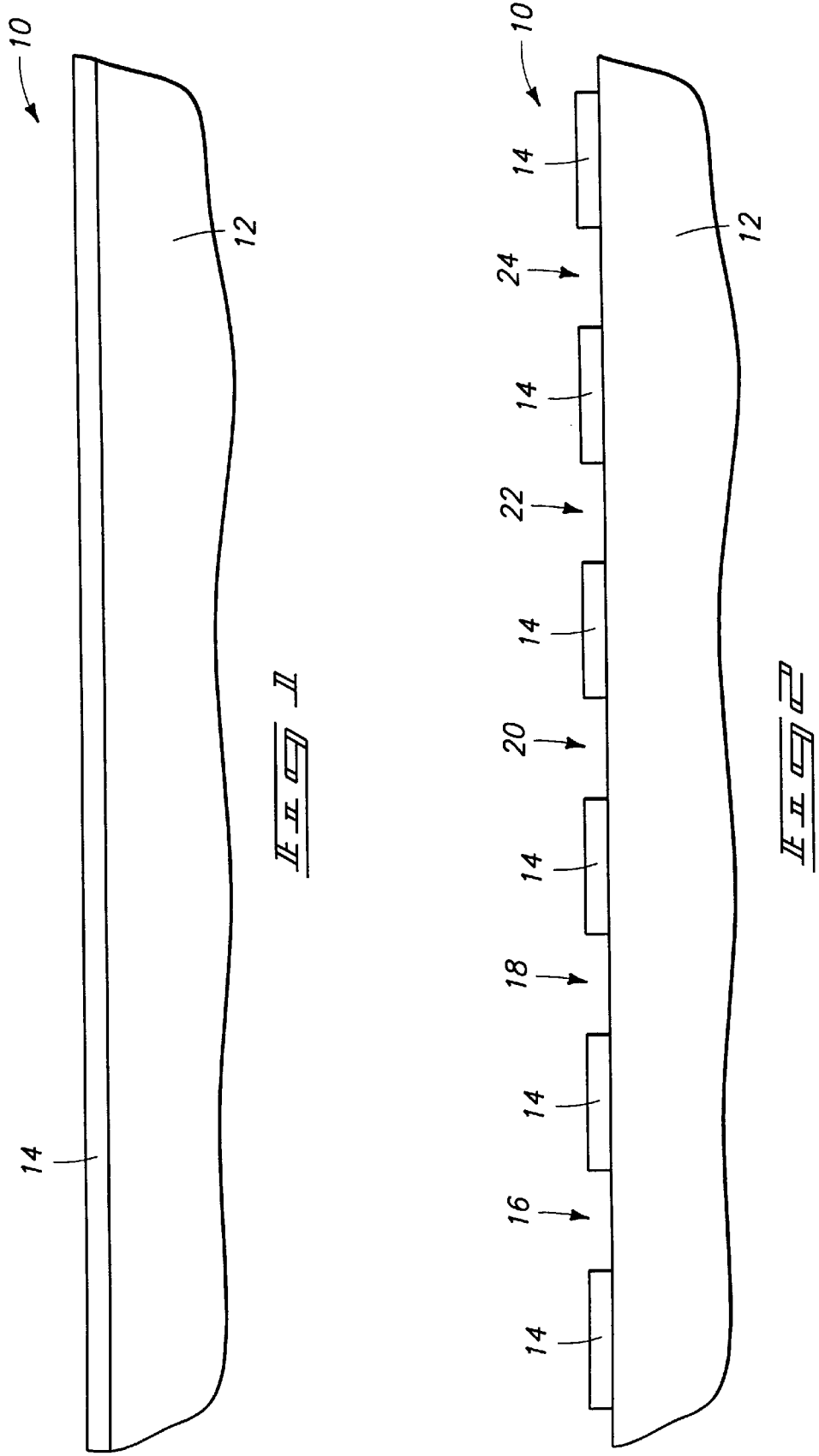

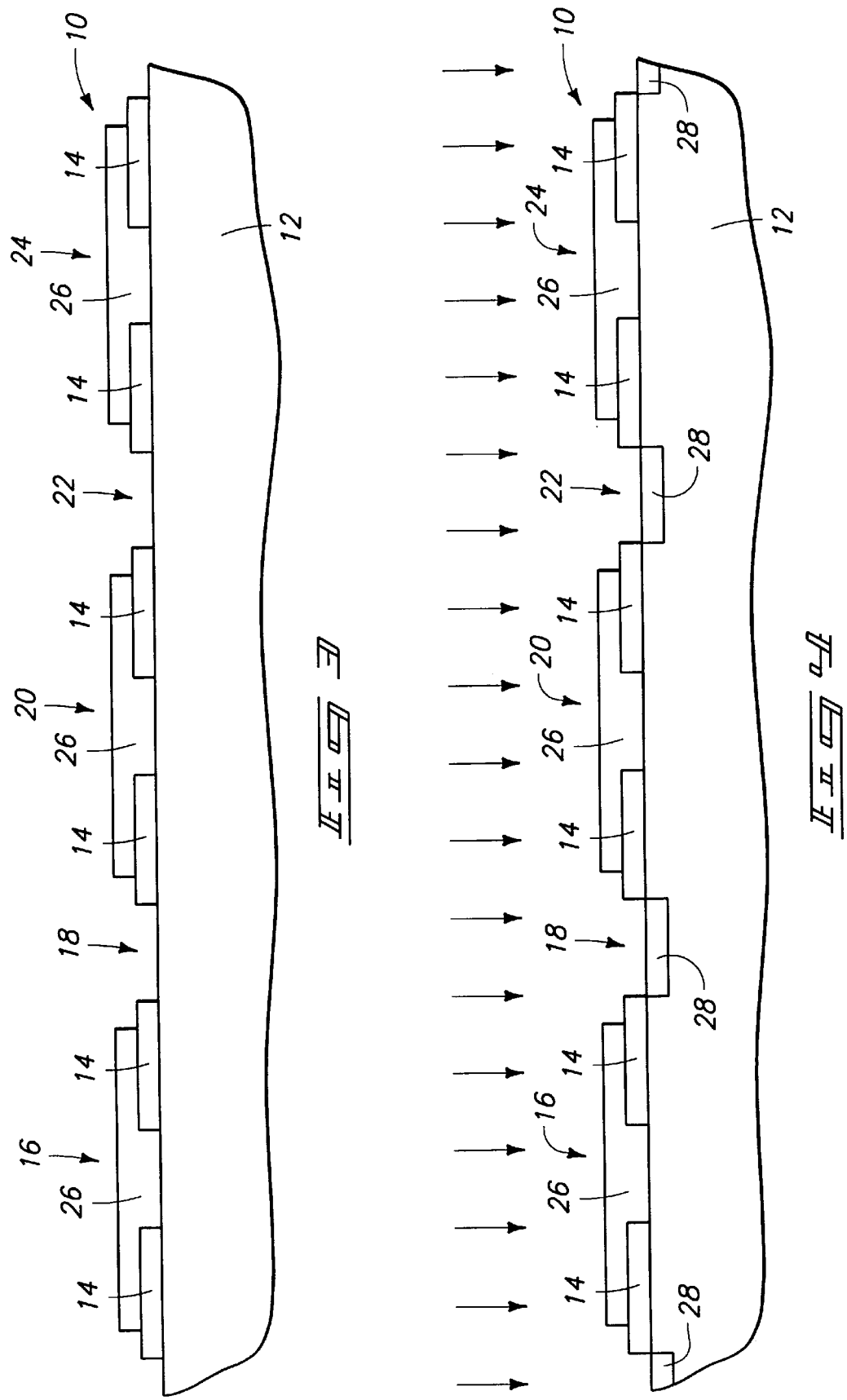

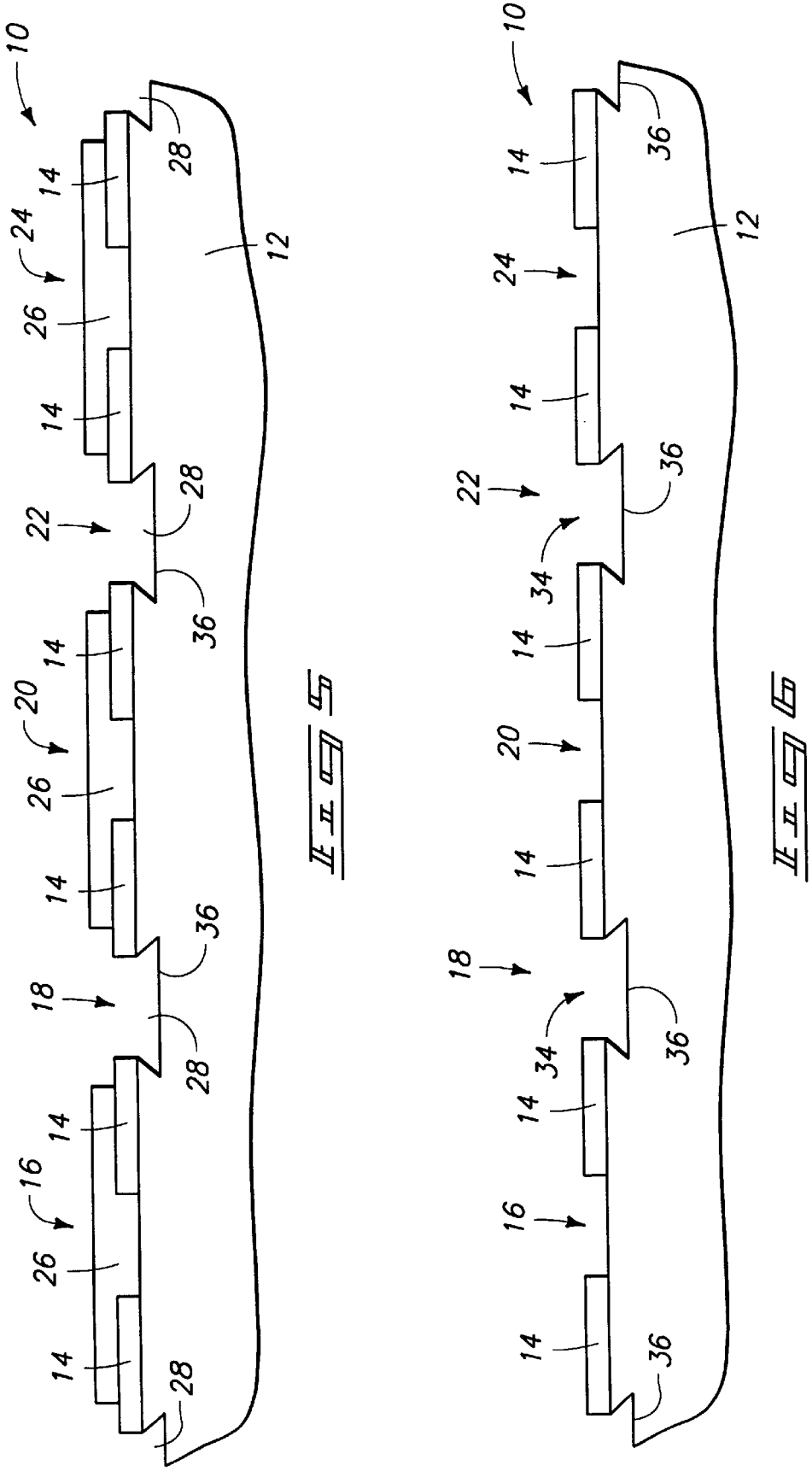

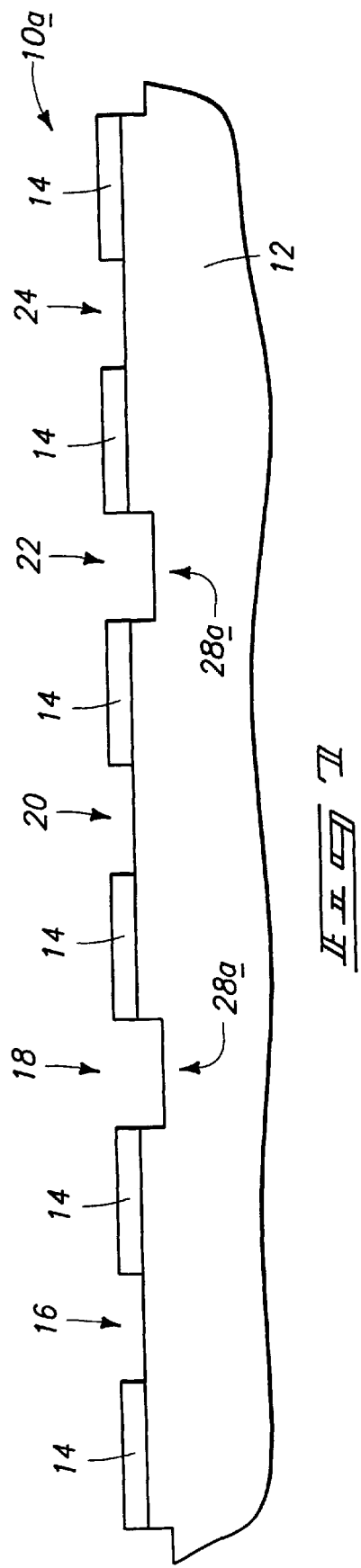

METHOD OF FORMING A CIRCUITRY FABRICATION MASK HAVING A SUBTRACTIVE ALTERNATING PHASE SHIFT REGION

TECHNICAL FIELD

This invention relates to methods of forming circuitry fabrication masks having a subtractive alternating phase shift region.

BACKGROUND OF THE INVENTION

In semiconductor manufacturing, photolithography is typically used in the formation of integrated circuits on a semiconductor wafer. During a lithographic process, a form of radiant energy such as ultraviolet light or electron beam is passed through a mask/reticle and onto the semiconductor wafer. The mask contains light restricting regions (for example totally opaque or attenuated/half-tone) and light transmissive regions (for example totally transparent) formed in a predetermined pattern. A grating pattern, for example, may be used to define parallel-spaced conductive lines on a semiconductor wafer.

The wafer is provided with a layer of energy sensitive resist material, for example photosensitive material commonly referred to as photoresist. Ultraviolet light passed through the mask onto the layer of photoresist transfers the mask pattern therein. The photoresist is then developed to remove either the exposed portions for a positive resist or the unexposed portions for a negative resist. The remaining patterned resist can then be used as a mask on the wafer during a subsequent semiconductor fabrication step, such as ion implantation or etching relative to layers on the wafer beneath the resist.

Advances in semiconductor integrated circuit performance have typically been accompanied by a simultaneous decrease in integrated circuit device dimensions and in the dimensions of conductor elements which connect those integrated circuit devices. The wavelength of coherent light employed in photolithographic processes by which integrated circuit devices and conductors are formed has typically desirably been smaller than the minimum dimensions within the reticle or mask through which those integrated circuit devices and elements are printed. At some point, the dimension of the smallest feature opening within the reticle approaches the wavelength of coherent light to be employed. Unfortunately, the resolution, exposure latitude and depth of focus in using such reticles and light decreases due to aberrational effects of coherent light passing through openings of width similar to the wavelength of the coherent light. Accordingly as semiconductor technology has advanced, there has traditionally been a corresponding decrease in wavelength of light employed in printing the features of circuitry.

One approach for providing high resolution printed integrated circuit devices of dimensions similar to the wavelength of coherent light utilized employs phase shift masks or reticles. In comparison with conventional reticles, phase shift masks typically incorporate alternating thicker and thinner transparent regions within the conventional chrome metal-on-glass reticle construction. These shifter regions are designed to produce a light transmissive substrate thickness related to the wavelength of coherent light passing through the phase shift mask. Specifically, coherent light rays passing through the light transmissive substrate and the shifter regions have different optical path lengths, and thus emerge from those surfaces with different phases. By providing light transmissive shifter regions to occupy alternating light transmitting regions of the patterned metal layer of a conventional phase shift mask of the Levenson type, adjacent bright areas are formed preferably 180° out-of-phase with one another. The interference effects of the coherent a light rays of different phase provided by a phase shift mask form a higher resolution image when projected onto a semiconductor substrate, with accordingly a greater depth of focus and greater exposure latitude.

Etching can be used to form the thinner regions of the light transmissive substrate. Such typically employs a timed dry anisotropic etch of the typical quartz substrate in one or more steps in an effort to achieve a near perfect 180° phase shift. The dry etching can cause quartz roughness which can result in transmission and phase error. Further, the etch may not be as anisotropic a s desired, resulting in an inwardly tapering "V" shape, which can also cause transmission errors. Further with a timed dry etch, it can be difficult to control the phase shift achieved. Further, defects can be created in the dry etching the density of which is hard to control.

Further and regardless, the etched spaces even if perfectly anisotropic typically transmit less light than adjacent unetched spaces due to total internal reflection along the sidewalls. Accordingly, the resultant image can consist of unevenly spaced lines/devices in spite of equal spacing on the mask.

A number of different techniques have been proposed to balance the transmission of etched versus adjacent unetched spaces. Such include blanket wet etching the entire reticle to enlarge both the etched and unetched spaces to undercut the chrome layer as well as widen the base of the quartz material. Yet, isotropically wet etching a reticle can create large masking layer overhangs and must be carefully timed.

Another method includes selectively wet etching just the phase shift regions while masking the non-shifted regions. Again, careful timing control is important to avoid over etching. Another method involves dry etching both shifted and non-shifted regions. Unfortunately, this can reduce the transmission of light passing through both the shifted and non-shifted regions, thus degrading the image quality.

Another method utilized in an effort to overcome the above-described problem is known as "data biasing". Here, the spacing on the mask between features is modified from that desired in the wafer such that the resultant desired intensity is achieved in the wafer and thereby the desired circuitry pattern is created.

Example prior art alternating phase shift mask fabrication techniques and masks are described in Uwe A. Griesinger et al., *Transmission & Phase Balancing of Alternating Phase Shifting Masks (5x)—Theoretical & Experimental Results*, SPIE99 #3873–36, pp. 1–11; and in Christophe Pierrat et al., *Phase-Shifting Mask Topography Effects on Lithographic Image Quality*, SPIE Vol. 1927 Optical/Laser Microlithography VI (1993), pp. 28–41.

SUMMARY

The invention includes methods of forming a circuitry fabrication mask having a subtractive alternating phase shift region. In one implementation, a light shielding layer is formed over a light transmissive substrate. The light shielding layer is patterned to have at least a portion having a first series of openings which alternate with a second series of openings. One of the first series of openings or the second series of openings is effectively masked while leaving the other of the first series of openings or the second series of openings effectively unmasked. While the one openings are effectively masked and the other openings are effectively unmasked, a species is ion implanted into the light transmissive substrate through the other openings. The implanted species effectively increases a wet etch rate of the light transmissive substrate in a wet etch chemistry compared to light transmissive substrate which is not effectively implanted with the species. The species implanted light transmissive substrate is wet etched through the other openings substantially selective to light transmissive substrate which is not effectively implanted with the species effective to at least partially form alternating phase shift regions through the other openings as compared to the alternating one openings.

Other implementations and aspects are contemplated.

BRIEF DESCRIPTION OF THE DRAWINGS

Preferred embodiments of the invention are described below with reference to the following accompanying drawings.

FIG. 1 is a diagrammatic sectional view of an alternating phase shift mask in process in accordance with an aspect of the invention.

FIG. 2 is a view of the FIG. 1 mask at a processing step subsequent to that depicted by FIG. 1.

FIG. 3 is a view of the FIG. 1 mask at a processing step subsequent to that depicted by FIG. 2.

FIG. 4 is a view of the FIG. 1 mask at a processing step subsequent to that depicted by FIG. 3.

FIG. 5 is a view of the FIG. 1 mask at a processing step subsequent to that depicted by FIG. 4.

FIG. 6 is a view of the FIG. 1 mask at a processing step subsequent to that depicted by FIG. 5.

FIG. 7 is an alternate embodiment view to that depicted by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Exemplary methods of forming a circuitry fabrication mask having a subtractive alternating phase shift region are described with reference to FIGS. 1–7. Referring initially to FIG. 1, a circuitry fabrication mask in process of formation is indicated generally with reference numeral 10. Such comprises a light transmissive substrate 12, preferably transparent, with quartz being an example. An example thickness for substrate 12 is 0.25". A light shielding layer 14 is formed over light transmissive substrate 12. Example materials are metal, such as chromium, deposited to an exemplary thickness of 70 to 100 nm.

Referring to FIG. 2, light shielding layer 14 has been patterned to have a first series of openings 16, 20 and 24 which alternate with a second series of openings 18 and 22. Typically, the first and second series of openings are totally of the same size and shape, or are preferably at least of the same size and shape in at least one cross-section, as shown, in the preferred implementation. The openings desirably correspond with a circuitry pattern to be fabricated on another substrate using the mask.

Referring to FIG. 3, one of the first series of openings or the second series of openings is effectively masked while leaving the other of the first series of openings or the second series of openings effectively unmasked. In the depicted described example, first series of openings 16, 20 and 24 are effectively masked while second series of openings 18 and 22 are effectively unmasked. The masking preferably comprises forming a masking material on the substrate, preferably by deposition at least within the openings being masked. Photoresist is one example material, although materials other than photoresist are also contemplated. Exemplary other materials include other resists, silicon nitride, and silicon. A preferred thickness for layer 26 is at least as thick as the deepest portion of an effective ion implant to be described subsequently.

Referring to FIG. 4, and while opening 16, 20 and 24 are effectively masked and the other openings 18 and 22 are effectively unmasked, a species is ion implanted into light transmissive substrate 12 through openings 18 and 22 to form implanted regions 28. In one implementation, the implanted species effectively increases an etch rate of the light transmissive substrate in an etch chemistry compared to light transmissive substrate which is not effectively implanted with the species. The etch process and etch chemistry can be wet or dry, with wet being much more preferred. By way of example only, example materials include gallium ions and phosphorous ions. Further, patentable novelty is seen in utilization of gallium ions in accordance with an aspect of the invention independent of increased etch rate in an etch chemistry. An exemplary implant dose is at least as great as $1 \times 10^{10}$ ions/cm$^2$ for both phosphorous and gallium. More preferably, the preferred dose for phosphorous is from $1 \times 10^{11}$ ions/cm$^2$ to $1 \times 10^{16}$ ions/cm$^2$, while that for gallium is from $6 \times 10^{13}$ ions/cm$^2$ through $6 \times 10^{15}$ ions/cm$^2$. The implanting might be conducted to achieve the desired implants such that a single subsequent etch produces a desired phase shift of 180°. Alternately, the implant depth might be chosen to be less than 180°, such that multiple implants and etching steps would be conducted. For example, at 248 nanometer wavelength of exposure light, a 60° phase angle correlates to a 776 angstrom depth removal of the quartz. An implant energy of approximately 80 kV could be utilized for the phosphorous implant in such instance. For a 180° phase shift result in one implant, 240 kV is an example implant power for phosphorous.

Referring to FIGS. 5 and 6, the species implanted light transmissive substrate 12 is etched through openings 18 and 22 using an etch chemistry to be substantially selective to light transmissive substrate material which is not effectively implanted with the species effective to at least partially form alternating phase shift regions 34 through openings 18 and 22. In the context of this document, "substantially selective" means an etch ratio of at least 2:1. Most preferably, selectivity is at least 5:1. Further, most preferably, wet etching is utilized although other etching chemistries are contemplated, with the invention only being limited by the accompanying claims appropriately interpreted in accordance with the doctrine of equivalents. Example etch chemistries for the above implant materials, doses, and quartz substrate include a mixture of NH$_4$F and HF. The NH$_4$F is preferably combined with the HF as a 40% solution in water. The HF is preferably combined with the NH$_4$F as an approximate 49% to 50% by volume HF in water. The preferred wet etching solution has a ratio of the above solutions of NH$_4$F to HF of from about 6:1 to about 60:1 by volume, with about 20:1 being an example preferred ratio. An example etching temperature is room temperature. An alternate example chemistry specifically for gallium is a 3% by volume NaOH solution in water. An example preferred etch temperature using such chemistry is 80° C.

An example dry etch chemistry for etching gallium implanted quartz and phosphorous implanted quartz is $CHF_3$ mixed with $O_2$.

In the illustrated exemplary preferred embodiment, particularly where there is a degree of lateral diffusion of the implanted species, alternating phase shift regions 34 have bases 36 which are wider in at least one cross-section than the light shielding layer openings 18 and 22 through which such alternating phase shift regions were etched. Further in the depicted preferred embodiment, alternating phase shift regions 18 and 22 are trapezoidal in shape in the illustrated cross-section.

Referring to FIG. 6, masking material 26 has been removed.

The above-described example conducted the phase shift region etching while openings 16, 20 and 24 were masked during such etching. The invention also contemplates unmasking such openings prior to conducting such etching such that openings 16, 20 and 24 are exposed during the phase shift region etching. Such can advantageously be conducted where significant differences in etch rates occur between the implanted and unimplanted light transmissive substrates due to very small removal of the unimplanted exposed area. Further subsequent processing, by way of example only, blanket wet etching after substantially forming the phase shift regions might also be conducted for pattern critical dimension balancing in the finished formed circuitry. Further, the illustrated and preferred outwardly-angled phase shift region sidewalls in the preferred trapezoidal shape can facilitate critical dimension balancing between the phased and unphased regions.

Alternately, but less preferred, FIG. 7 illustrates another embodiment 10a whereby substantially vertical sidewalls are achieved in forming regions 28a in accordance with methodical aspects of the invention as might be more readily achieved where the implanted regions were dry etched as opposed to wet etched.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a circuitry fabrication mask having a subtractive alternating phase shift region, comprising:

forming a light shielding layer over a light transmissive substrate;

patterning the light shielding layer to have at least a portion having a first series of openings which alternate with a second series of openings;

effectively masking one of the first series of openings or the second series of openings while leaving the other of the first series of openings or the second series of openings effectively unmasked;

while the one openings are effectively masked and the other openings are effectively unmasked, ion implanting a species into the light transmissive substrate through the other openings, the implanted species increasing a wet etch rate of the light transmissive substrate in a wet etch chemistry compared to the light transmissive substrate which is not effectively implanted with the species; and wet etching the species implanted light transmissive substrate through the other openings substantially selective to the light transmissive substrate which is not effectively implanted with the species effective to at least partially form alternating phase shift regions through the other openings as compared to the one openings.

2. The method of claim 1 wherein the first and second series of openings are totally of the same size and shape.

3. The method of claim 1 wherein the first and second series of openings are of the same size and shape in at least one cross section.

4. The method of claim 1 wherein the light transmissive substrate is transparent.

5. The method of claim 1 wherein the masking comprises forming a masking material within the one openings, the masking material comprising photoresist.

6. The method of claim 1 wherein the masking comprises forming a masking material within the one openings, the masking material not comprising photoresist.

7. The method of claim 1 wherein the species comprises phosphorus ions.

8. The method of claim 1 wherein the species comprises gallium ions.

9. The method of claim 1 wherein the one openings are masked during the wet etching.

10. The method of claim 1 wherein the one openings are unmasked during the wet etching.

11. The method of claim 1 wherein the wet etching comprises etching to form bases of the alternating phase shift regions which are wider in at least one cross section than the other openings in the light shielding layer.

12. The method of claim 11 wherein the alternating phase shift regions are trapezoidal in shape in the at least one cross section.

13. A method of forming a circuitry fabrication mask having a subtractive alternating phase shift region, comprising:

forming a light shielding layer over a light transmissive substrate;

patterning the light shielding layer to have at least a portion having a first series of openings which alternate with a second series of openings;

effectively masking one of the first series of openings or the second series of openings while leaving the other of the first series of openings or the second series of openings effectively unmasked;

while the one openings are effectively masked and the other openings are effectively unmasked, ion implanting gallium ions into the light transmissive substrate through the other openings, the implanted gallium increasing an etch rate of the light transmissive substrate in an etch chemistry compared to the light transmissive substrate which is not effectively implanted with the gallium; and etching the gallium implanted light transmissive substrate through the other openings substantially selective to the light transmissive substrate which is not effectively implanted with gallium to at least partially form alternating phase shift regions through the other openings as compared to the one openings.

14. The method of claim 13 wherein the etching comprises wet etching.

15. The method of claim 13 wherein the etching comprises dry etching.

16. The method of claim 13 wherein the masking comprises forming a masking material within the one openings, the masking material comprising photoresist.

17. The method of claim 13 wherein the masking comprises forming a masking material within the one openings, the masking material not comprising photoresist.

18. The method of claim 13 wherein the one openings are masked during the etching.

19. The method of claim 13 wherein the one openings are unmasked during the etching.

20. A method of forming a circuitry fabrication mask having a subtractive alternating phase shift region, comprising:

forming a light shielding layer over a light transmissive substrate;

patterning the light shielding layer to have at least a portion having a first series of openings which alternate with a second series of openings;

effectively masking one of the first series of openings or the second series of openings while leaving the other of the first series of openings or the second series of openings effectively unmasked;

while the one openings are effectively masked and the other openings are effectively unmasked, ion implanting a species into the light transmissive substrate through the other openings, the implanted species increasing an etch rate of the light transmissive substrate in an etch chemistry compared to the light transmissive substrate which is not effectively implanted with the species; and etching the species implanted light transmissive substrate through the other openings substantially selective to the light transmissive substrate which is not effectively implanted with the species effective to at least partially form alternating phase shift regions through the other openings which have bases which are wider in at least one cross section than the light shielding layer openings through which such alternating phase shift regions were etched.

21. The method of claim 20 wherein the alternating phase shift regions are trapezoidal in shape in the at least one cross section.

22. The method of claim 20 wherein the etching comprises wet etching.

23. The method of claim 20 wherein the etching comprises dry etching.

24. The method of claim 20 wherein the masking comprises forming a masking material within the one openings, the masking material comprising photoresist.

25. The method of claim 20 wherein the masking comprises forming a masking material within the one openings, the masking material not comprising photoresist.

26. The method of claim 20 wherein the one openings are masked during the etching.

27. The method of claim 20 wherein the one openings are unmasked during the etching.

28. The method of claim 20 wherein the species comprises phosphorus ions.

29. The method of claim 20 wherein the species comprises gallium ions.

30. A method of forming a circuitry fabrication mask having a subtractive alternating phase shift region, comprising:

forming a light shielding layer over a light transmissive substrate;

patterning the light shielding layer to have at least a portion having a first series of openings which alternate with a second series of openings;

effectively masking one of the first series of openings or the second series of openings while leaving the other of the first series of openings or the second series of openings effectively unmasked;

while the one openings are effectively masked and the other openings are effectively unmasked, ion implanting a species into the light transmissive substrate through the other openings, the implanted species increasing an etch rate of the light transmissive substrate in an etch chemistry compared to the light transmissive substrate which is not effectively implanted with the species;

after the ion implanting, unmasking the one openings;

after the unmasking and while the one openings are unmasked, etching the species implanted light transmissive substrate through the other openings substantially selective to the light transmissive substrate which is not effectively implanted with the species effective to at least partially form alternating phase shift regions through the other openings as compared to the one openings.

31. The method of claim 30 wherein the masking comprises forming a masking material within the one openings, the masking material comprising photoresist.

32. The method of claim 30 wherein the masking comprises forming a masking material within the one openings, the masking material not comprising photoresist.

33. The method of claim 30 wherein the etching comprises wet etching.

34. The method of claim 30 wherein the etching comprises dry etching.

35. The method of claim 30 wherein the species comprises phosphorus ions.

36. The method of claim 30 wherein the species comprises gallium ions.

* * * * *